United States Patent [19]

Furuyama et al.

[11] Patent Number: 4,697,252
[45] Date of Patent: Sep. 29, 1987

[54] DYNAMIC TYPE SEMICONDUCTOR MEMORY DEVICE

[75] Inventors: Tohru Furuyama, Ithaca, N.Y.; Yukimasa Uchida, Yokohama, Japan

[73] Assignee: Tokyo Shibaura Denki Kabushiki Kaisha, Japan

[21] Appl. No.: 587,975

[22] Filed: Mar. 9, 1984

[30] Foreign Application Priority Data

Mar. 10, 1983 [JP] Japan .................................. 58-39550

[51] Int. Cl.$^4$ ........................ G11C 7/00; G11C 11/24
[52] U.S. Cl. ..................................... 365/189; 365/149
[58] Field of Search ............... 365/189, 230, 149, 182; 357/23.6

[56] References Cited

U.S. PATENT DOCUMENTS

| | | | |
|---|---|---|---|
| 3,938,109 | 2/1976 | Gionis et al. | 365/230 |
| 4,364,075 | 12/1982 | Bohr et al. | 357/23.6 |
| 4,511,811 | 4/1985 | Gupta | 365/230 |

OTHER PUBLICATIONS

Chwang et al., "A 70ns High Density CMOS DRAM," IEEE International Solid-State Circuits Conference, ISSCC 83, pp. 56-57, 2/23/83.
Mano et al., "Submicron VLSI Memory Circuits," IEEE International Solid-State Circuits Conference, ISSCC 83, pp. 234-235, 2/25/83.

Primary Examiner—James W. Moffitt
Attorney, Agent, or Firm—Finnegan, Henderson, Farabow, Garrett & Dunner

[57] ABSTRACT

A dynamic type semiconductor memory device is disclosed, which comprises an n-type semiconductor layer, at least one memory cell having a capacitor for storing charges of an amount corresponding to a logic value and a first transistor having source and drain regions formed in the surface area of the p-type semiconductor layer and for transferring charges to and from the capacitor, a first drive circuit for applying a voltage to the gate of the first transistor through a word line, a second drive circuit for selectively applying a voltage of one of first and second levels through a bit line and the first transistor to the capacitor, and a bias circuit for applying a voltage to the substrate. The first transistor of the memory device is a p-channel transistor formed in the n-type semiconductor layer which is formed in the surface area of a p-type semiconductor layer. The bias circuit includes a charge pump section for setting the potential of the substrate at a third level lower than the first voltage.

14 Claims, 17 Drawing Figures

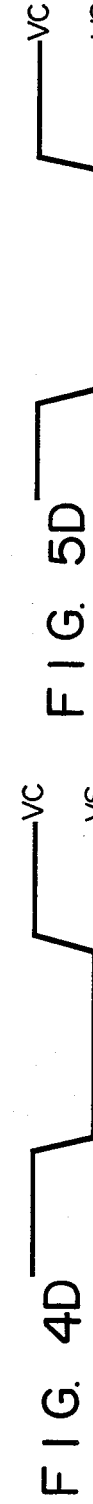
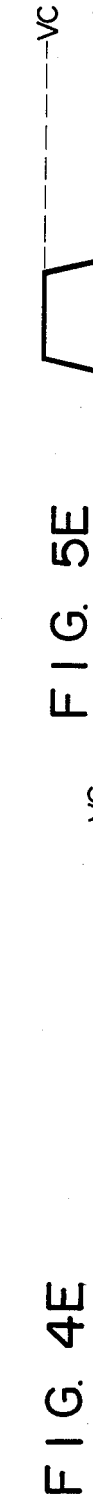
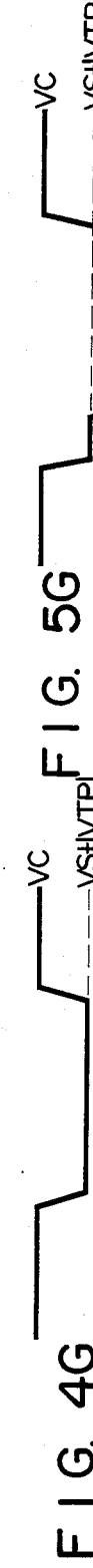
FIG. 4A  FIG. 4B  FIG. 4C  FIG. 4D  FIG. 4E  FIG. 4F  FIG. 4G
FIG. 5A  FIG. 5B  FIG. 5C  FIG. 5D  FIG. 5E  FIG. 5F  FIG. 5G

DYNAMIC TYPE SEMICONDUCTOR MEMORY DEVICE

BACKGROUND OF THE INVENTION

This invention relates to a dynamic type semiconductor memory device.

Many computers utlize dynamic RAM as main memory. The memory cell of the dynamic RAM comprises a capacitor for storing charges of an amount corresponding to a logic value and a transfer gate for the movement of charges to and from the capacitor. Generally, the memory cell of the dynamic RAM comprises few circuit elements so that it does not occupy much area. With dynamic RAM, more memory cells than in the case of a static RAM, for instance, can be provided in a single package, and the cost required for storing one bit data is inexpensive.

The dynamic RAM has many memory cells and a control circuit for selectively operating the memory cells at the time of the reading and writing operations. Heretofore, these memory cells and control circuit have been implemented with n-channel MOS transistors and MOS capacitors which can be readily fabricated.

Where minute n-channel MOS transistors and MOS capacitors are formed to increase the memory capacity of the dynamic RAM, there arises the following problem.

When a high level voltage is applied between the source and drain of a minute n-channel MOS transistor, excited carriers (i.e., hot electrons) are liable to intrude into and be trapped by an oxide insulator on the channel. Many n-channel MOS transistors in the dynamic RAM operate in the operating range of a pentode characteristic, in which the drain current is saturated, so that the dynamic RAM is subject to erroneous operation due to the trapping. Particularly, the trapping that occurs in an n-channel MOS transistor used as the transfer gate of a memory cell, permits erroneous data to be written in and read out from the capacitor of the memory cell.

In another aspect, a voltage signal which is applied to the gate of a MOS transistor in the memory cell via a word line does not rise quickly and also the electric conductivity of the channel of the transistor is low, so that high speed read/write operation cannot be obtained.

Further, the capacitor does not have an electrode area large enough to store charges sufficient for the discrimination of a logic value.

In the prior art dynamic RAM which is fabricated by taking the above problems into considerations, the memory cells and control circuit are partly constituted by p-channel MOS transistors, in which carriers are not so easily excited as in n-channel MOS transistors. The MOS capacitor in the memory cell has one end connected to a bit line through the current path of a p-channel MOS transistor which is used as a transfer gate, while its other end is grounded. The gate of the p-channel MOS transistor is connected to a word line. During a stand-by period of the memory cell, a precharging voltage is applied to the bit line. This voltage is equal to the voltage applied to the word line to render the p-channel MOS transistor nonconductive. When operating the memory cell, a low level voltage is applied to the word line to render the p-channel MOS transistor conductive. With this arrangement, the p-channel MOS transistor operates in the range of a triode characteristic, in which the drain current is not saturated, so that the operation speed can be improved.

With the dynamic RAM mentioned, however, it has been impossible to apply a charging voltage to the capacitor efficiently when writing data. More specifically, the capacitor in the memory cell is connected to the bit line through the current path of the p-channel MOS transistor. A voltage drop corresponding to the threshod voltage of the transistor occurs, so that only a voltage equal to the potential on the bit line minus the threshold voltage of the transistor can be applied to the capacitor. Denoting the potential level on the bit line by VC and the threshold voltage of the p-channel MOS transistor by VTH, a voltage (VC−VTH) is supplied to the capacitor. Voltage of the level VC may be applied to the capacitor by merely providing means for bootstrapping the potential on the word line to the level (VC+VTH). However, in view of the voltage drop across the transfer gate transistor corresponding to the threshold voltage VTH, a node with potential thereon bootstrapped to a level in excess of (VC+2VTH) is necessary. This means a disadvantage in that a high voltage must be applied to the minute MOS transistor.

SUMMARY OF THE INVENTION

An object of the invention is to provide a dynamic type semiconductor memory, which is capable of high density integration without spoiling the reliability of operation and permits efficient voltage application to the memory cell capacitor.

According to the invention, there is provided a dynamic type semiconductor memory device, which comprises a semiconductor body including a first layer of one conductivity type and a second layer of an opposite conductivity type formed in contact with the first layer is formed, at least one memory cell having a first MOS transistor whose source and drain regions of the opposite conductivity type are formed in the surface area of the first layer, and a first capacitor connected to a bit line through a current path of the first MOS transistor, a bias circuit for applying an output voltage to the first layer to apply a reverse bias voltage between the first and second layers, a first drive circuit for setting the potential of a word line connected to the gate of the first MOS transistor in accordance with the output voltage from said bias means to render the first MOS transistor conductive, and a second drive circuit for selectively setting the potential of the bit line at one of a first level and a second level higher than the first level.

According to the present invention, a voltage which is variable over greater range than the variable range of the voltage applied to the bit line is applied to the word line, so that it is possible to cancel the voltage drop corresponding to the threshold voltage of the first MOS transistor. No undesirable high electric field exists in the memory cells.

BRIEF DESCRIPTION OF THE DRAWINGS

FIGS. 4(A) to 4(G) are timing charts for explaining the reading operation of the semiconductor memory device shown in FIGS. 1 through 3; and FIGS. 5(A) to 5(G) are timing charts for explaining the writing operation of the semiconductor memory device shown in FIGS. 1 through 3.

DETAILED DESCRIPTION OF THE PREFERRED EMBODIMENT

Figure 1:
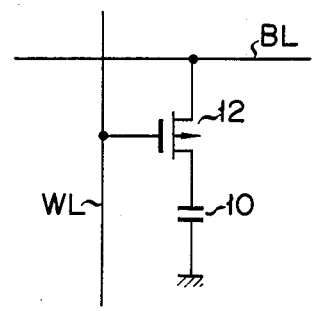
FIG. 1 is a circuit diagram of a memory cell in an embodiment of the dynamic type semiconductor memory device according to the invention.

An embodiment of the dynamic type semiconductor memory device according to the invention will now be described with reference to FIGS. 1 to 3. This memory device has m x n memory cells connected in the form of a matrix array of m bit lines and n word lines. FIG. 1 shows one of the memory cells. The memory cell includes a capacitor 10 for storing charges of an amount corresponding to a logic data value and a p-channel MOS transistor 12 whose current path is connected between the capacitor 10 and a bit line BL and whose conduction state is controlled via a word line WL.

Figure 2:
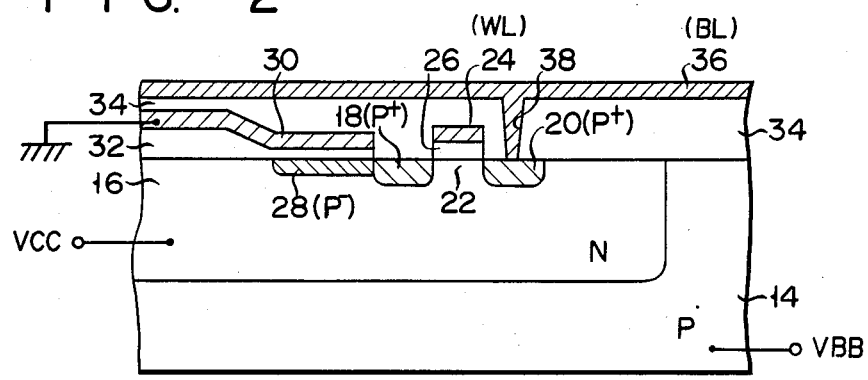
FIG. 2 is a schematic cross sectional view showing the internal structure of the memory cell shown in FIG. 1.

FIG. 2 shows the structure of the memory cell shown in FIG. 1. The memory cell is provided with a p-type semiconductor substrate 14 having an n-type well 16 formed in a surface area of the substrate 14. $P^+$-type regions 18 and 20 are formed in a surface area of the well 16. The regions 18 and 20 and a region 22 intervening therebetween form a current path of the transistor 12 shown in FIG. 1. A conductive layer 24 is formed over the region 22 via an insulation layer 26 to be used as the gate of the transistor 12 and at the same time it is formed to extend perpendicular to a direction of the current path to be used as the word line WL shown in FIG. 1. The region 18 is electrically connected to a $p^-$-type region 28 formed in the well 16. This region 28 forms the capacitor 10 shown in FIG. 1 in cooperation with a conductive layer 30 formed over it via an insulation layer 32. The conductive layer 30 is grounded. An insulation layer 34 is formed to cover the surfaces of the substrate 14 and conductive layers 30 and 24. A conductive layer 36 is formed on the insulation layer 34, and electrically connected to the region 20 through a hole 38 formed in the insulation layer 34. The conductive layer 36 extends perpendicular to a direction in which the conductive layer 24 extends to be used as the bit line BL shown in FIG. 1. The layer 36 (i.e., bit line BL) is connected to a usual precharger (not shown) for selectively setting a potential of the bit line BL at one of a first level VS (e.g., 0 V) and a second level VC (e.g., 5 V) higher than the first level VS and a usual sense amprifier (not shown) for detecting a change in the potential on the bit line BL.

Figure 3:
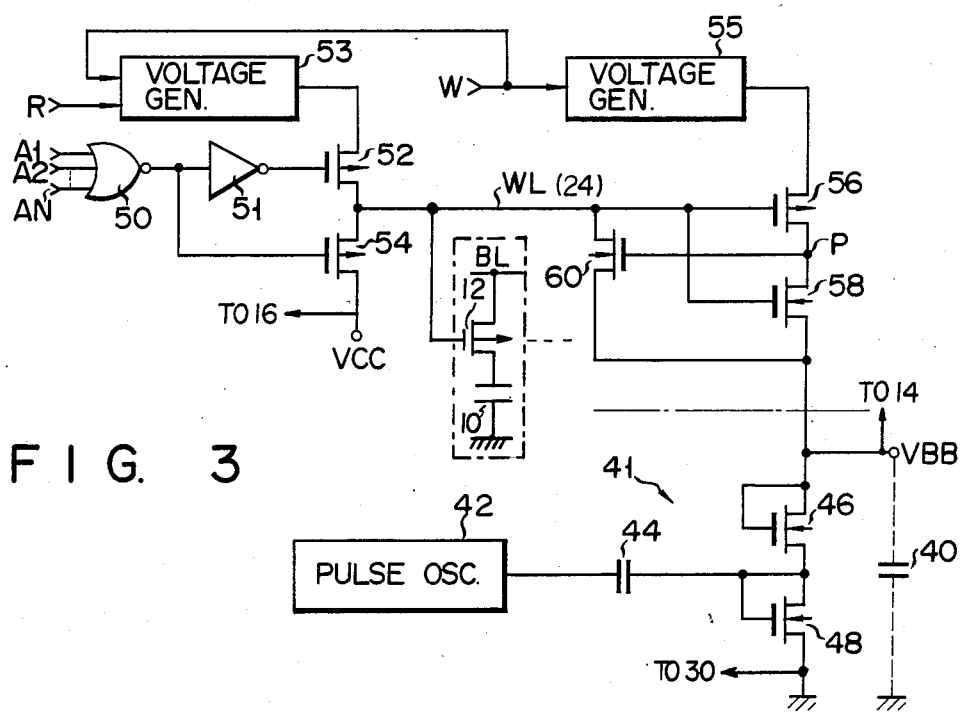
FIG. 3 is a schematic representation of a driving circuit and a bias circuit connected to the memory cell shown in FIG. 1.

FIG. 3 shows a circuit for setting the potentials of the layer 24 (i.e., word line WL) and substrate 14. Capacitor 40 represents the capacitance between the substrate 14 and conductive layer 30 of the memory cell of FIG. 1. The circuit of FIG. 3 includes a charge pump section 41 for decreasing the potential of the substrate 14 to a third level VB (e.g., $-2$ V) which is lower than the first level VS, via an output terminal VBB. The section 41 includes a pulse oscillator 42, a capacitor 44 and n-channel MOS transistors 46 and 48. One end of the current path of the transistor 46 is connected to the terminal VBB, and its other end is grounded through the current path of the transistor 48. The gates of the transistors 46 and 48 are connected to their drains. The oscillator 42 is connected through the capacitor 44 to the juncture between the transistors 46 and 48.

The circuit of FIG. 3 further includes a NOR gate 50, an inverter 51, voltage generators 53 and 55, p-channel transistors 52, 54 and 56 and n-channel transistors 58 and 60. When receiving a predetermined combination of address signals A1 to AN, the NOR gate 50 provides a select signal of a high level "H". The NOR gate 50 is connected through the inverter 51 to the gate of the transistor 52, and it is also directly connected to the gate of the transistor 54. One end of the current path of the transistor 52 is connected to the output terminal of the voltage generator 53, and its other end is connected through the current path of the transistor 54 to a terminal VCC, to which a voltage of level VC is applied from a power supply (not shown). This terminal VCC is connected to the n-type well 16 shown in FIG. 2. Instead, the n-type well 16 may be connected to receive a voltage of a fourth level VD (e.g., 7 V) higher than level VC.

The voltage generator 53 provides a voltage of level VS only while a first control signal R or a second control signal W is at high level "H" and otherwise provides a voltage of level VC. The word line WL is connected to the juncture between the transistors 52 and 54, and to the gates of the transistors 56 and 58. One end of the current path of the transistor 56 is connected to the output terminal of the voltage generator 55, and its other end is connected through the current path of the transistor 58 to the terminal VBB. The voltage generator 55 provides a voltage of level VC only for a predetermined period of time in response to the second control signal W at high level "H" and otherwise provides a voltage of level VS. The gate of the transistor 60 is connected to the juncture between the transistors 56 and 58, and its current path is connected between the word line WL and terminal VBB.

The operation of the memory device described above will now be described with reference to FIGS. 4(A) to 4(G), and 5(A) to 5(G). It is assumed that the n-type well 16 is held at a potential of level VC. Immediately after a clock pulse output is generated from the oscillator 42, the potential on the substrate 14 is thought to be at ground level (i.e., 0 V). The voltage across the capacitor 44 increases in response to the rising of clock pulse from the oscillator 42. When this voltage exceeds the threshold voltage VTN of the n-channel transistor, a discharging current is caused to flow from the capacitor 44 through the transistor 48 to the ground to reduce the voltage across the capacitor 44. When the voltage across the capacitor 44 is reduced and becomes lower than the threshold voltage VTN, the transistor 48 is rendered nonconductive. With the subsequent falling of clock pulse from the oscillator 42, a charging current is caused to flow from the substrate 14 through the terminal VBB and transistor 46 to the capacitor 44. The discharging and charging sequence as described above is repeated as the oscillator 42 continuously provides clock pulses, whereby the potential on the substrate 14 is reduced to the level VB (i.e., $-VC+2|VTN|$).

When the first and second control signals R and W are both at low level "L", the voltage generators 53 and 55 respectively provide voltages of levels VC and VS. The word line WL is supplied with the voltage of level VC through one of the transistors 52 and 54 regardless of the select signal from the NOR gate 50. When the transistors 56 and 58 are respectively rendered nonconductive and conductive in response to this voltage, a voltage of level VB is applied from the terminal VBB to the gate of the transistor 60. Thus, the transistor 60 is not rendered conductive, and the potential on the word line WL is held at the level VC. In other words, the transistor 12 connected to the word line WL is nonconductive, and the memory cell is in the stand-by state.

In the read operation, a precharging voltage of level VC is applied to the bit line BL. The first control signal R rises as shown in FIG. 4(B) while the transistor 52 is conductive in response to the select signal of high level "H" as shown in FIG. 4(A). The second control signal W at this time is at low level "L" as shown in FIG. 4(G). The voltage generator 53 thus provides a voltage of level VS as shown in FIG. 4(D). The potential on the word line WL is reduced from level VC to level VS+|VTP| (VTP being the threshold voltage of the p-channel MOS transistor). The voltage generator 55 provides a voltage of level VS as shown in FIG. 4(E) but the potential at point P is held at level VB as shown in FIG. 4(F), so that the transistor 60 remains nonconductive. When the potential on the word line WL is reduced and becomes lower than the level VC−|VTP|, the transistor 12 in the memory cell is rendered conductive, and subsequently it operates in the range of a triode characteristic. The amount of charges in the capacitor 10 is detected by the sense amplifier (not shown) through the transistor 12 and bit line BL.

In the write operation, the first control signal R, as shown in FIG. 5(B), rises during the conduction period of the transistor 52 in response to the select signal of high level "H" as shown in FIG. 5(A). The second control signal W rises after the rising of the first control signal as shown in FIG. 5(C). The voltage generator 53 thus provides a voltage of level VS during the high level period of one of the signals W and R, as shown in FIG. 5(D). The voltage generator 55 provides a voltage of level VC for a predetermined period in response to the rising of the signal W, as shown in FIG. 5(E). When the potential on the word line WL is reduced to the level VS+|VTP| according to the output of the voltage generator 53, the transistors 56 and 58 are rendered conductive and nonconductive, respectively. In response to the rising of output from the generator 55, the potential on the point P is increased to a level VC−ΔV, which is determined by the resistance ratio between the transistors 56 and 58 and a current flowing through the transistors 56 and 58. The transistor 60 is thus rendered conductive, causing the potential on the word line WL to be further reduced to the level VB in FIG. 5(G). Even with the change of the potential on the point P to the level VS in response to the falling of the output of the voltage generator 55, the transistor 60 is not rendered nonconductive so long as a condition VS−VTN>VB is satisfied. In this case, the voltage of level VB continues to be applied through the word line WL to the transistor 12 in the memory cell until the falling of the second control signal W. When voltage of level VC is applied to the bit line BL during this time, a logic value "1" is stored in the capacitor 10 in the memory cell. On the other hand, when voltage of level VS is applied, a logic value "0" is stored.

Since the transistor 58 has a very high resistance in the nonconductive state, a smaller amount of consumption current flows through the transistors 56 and 58 due to the presence of the leakage current therethrough. The potential of the level VB is subject to less variations because it is applied to the substrate 14 having a large capacitance.

With the dynamic type semiconductor memory device described above, the potential on the substrate 14 is reduced to the level VB by charge pumping, and a voltage which is lower than the level VS is applied to the word line WL, so that it is possible to cancel the voltage drop corresponding to the threshold voltage of the transistor 12 in the memory cell. At this time, unlike the prior art case, no unnecessary high electric field is applied to the MOS transistors. In addition, the p-channel transistor 12 operates in the range of a triode characteristic, so that a high readout speed can be obtained.

In the above embodiment the charge pump section 41 is connected to the semiconductor substrate 14. However, it is possible to connect the charge pump section 41 to the n-type well 16. In this case, an n-channel MOS transistor and a capacitor are formed in the surface area of the semiconductor substrate 14 in the same manner as the MOS transistor 12 and capacitor 10, and used instead of the MOS transistor 12 and capacitor 10 to form a memory cell. Further, the substrate 14 is set at a potential of VS level, and the potential of the n-type well 16 is set at a level VB1 (e.g., 7.0 V) higher than the level VC by a charge pump section which is used instead of the charge pumping section 41. In write-in operation, the potential of the word line WL is changed from the level VS to the level VB1 to render the n-channel MOS transistor of the memory all conductive, and the potential of the bit line BL is selectively set to one of the levels VS and VC. Thus, the same effects as in the above embodiment can be obtained.

In the above embodiment, the n-type well 16 is formed in the p-type semiconductor substrate 14 and the memory cell is formed in the well 16. However, a p-type well may be formed in an n-type semiconductor substrate.

Where a p-type well is formed in an n-type semiconductor substrate and a memory cell having an n-channel MOS transistor and a capacitor is formed in the p-type well, the potential of the n-type semiconductor substrate is set at a level VB2 (e.g., 7.0 V) higher than the level VC by a charge pump section which is used instead of the charge pump section 41, and the potential of the p-type well is set at a level equal to or lower than the level VS. In write-in operation, the potential of a word line is changed from the level VS to the level VB2 to render the n-channel MOS transistor of the memory cell conductive, and the potential of a bit line is selectively set to one of the levels VS and VC.

Where a p-type well is formed in an n-type semiconductor substrate and a memory cell having a p-channel MOS transistor and a capacitor is formed in the n-type substrate, the potential of the p-type well is set at a level VB3 (e.g., −2 V) lower than the level VS by a charge pump section 41, the potential of the n-type substrate is set at a level equal to or higher than the level VC. In write-in operation, the potential of a word line is changed from the level VC to the level VB3 to render the p-channel MOS transistor of the memory cell conductive, and the potential of a bit line is selectively set to one of the levels VS and VC.

The charge pump section 41 may be formed in the substrate 14, or in a substrate formed separately from the substrate 14.

As has been described in the foregoing, the dynamic type semiconductor memory device is capable of high density integration without spoiling the reliability of operation. Also, the voltage for writing data can be efficiently applied to the capacitor in the memory cell.

What is claimed is:

1. A dynamic type semiconductor memory device comprising:
a semiconductor substrate of a first conductivity type having a charge associated therewith;
a well region of a second conductivity type formed in the surface area of said semiconductor substrate;
charge pumping means for selectively varying the charge in said semiconductor substrate so as to reverse-bias said semiconductor substrate with respect to said well region;
a plurality of word lines;
a plurality of memory cells each including a MOS transistor and a capacitor, said MOS transistor of each of said cells being of a first conductivity type which has a gate electrode connected to one of said word lines and a current path formed in the surface area of said well region, with said capacitor of each of said cells storing data corresponding to a voltage supplied through the current path of said MOS transistor of the cell; and
driving means for selecting one of said word lines and for applying the charge in said semiconductor substrate to the selected word line to turn on each MOS transistor connected to the selected word line.

2. A dynamic type semiconductor memory device according to claim 1, wherein said driving means includes a decoding circuit for decoding an address signal, and a connecting circuit for selectively connecting one of said word lines to said semiconductor substrate under control of said decoding circuit.

3. A dynamic type semiconductor memory device according to claim 2, wherein said decoding circuit includes an enable section for generating an enable signal in response to the address signal of a specific value, and said connecting circuit includes a switching section connected between a predetermined one of said word lines and said substrate for turning on a corresponding one of said MOS transistors in response to the enable signal.

4. A dynamic type semiconductor memory device according to claim 3, wherein said switching section is connected to said enable section via said predetermined word line to receive the enable signal.

5. A dynamic type semiconductor memory device according to claim 4, wherein said switching section includes a second MOS transistor of the second conductivity type having a current path connected between said predetermined word line and said semiconductor substrate.

6. A dynamic type semiconductor memory device comprising:
a semiconductor substrate of a first conductivity type having a charge associated therewith;
a well region of a second conductivity type formed in the surface area of said semiconductor substrate;
charge pumping means for selectively varying the charge in said semiconductor substrate so as to reverse-bias said semiconductor substrate with respect to said well region;
a plurality of word lines;
a plurality of memory cells each including a MOS transistor and a capacitor, said MOS transistor of each of said cells being of a first conductivity type which has a gate electrode connected to one of said word lines and a current path formed in the surface area of said well region, with said capacitor of each of said cells storing data corresponding to a voltage supplied through the current path of said MOS transistor of the cell; and
driving means for selecting one of said word lines and for applying the charge in said semiconductor substrate to the selected word line to turn on each MOS transistor connected to the selected word line, said driving means including a decoding circuit for decoding an address signal and a connecting circuit for selectively connecting one of said word lines to said semiconductor substrate under control of said decoding circuit,
said decoding circuit including an enable section for generating an enable signal in response to the address signal of a specific value, and said connecting circuit including a switching section connected between a predetermined one of said word lines and said substrate for turning on a corresponding one of said MOS transistors in response to the enable signal,
said switching section being connected to said enable section via said predetermined word line to receive the enable signal, said switching section including a second MOS transistor of the second conductively type having a current path connected between said predetermined word line and said semiconductor substrate, wherein
said driving means includes first and second voltage generators for generating respective first and second voltages, and said enable section includes a third MOS transistor of the first conductivity type having a current path connected between an output terminal of said first voltage generator and said predetermined word line for selectively supplying the first voltage as said enable signal, and said switching section includes fourth and fifth MOS transistors of the first and second conductivity types having gates connected to said predetermined word line and current paths connected in series between an output terminal of said second voltage generator and said semiconductor substrate, for supplying a turn on voltage to a gate electrode of said second MOS transistor in response to the first voltage.

7. A dynamic type semiconductor memory device according to claim 6, wherein said first voltage generator has an input terminal for receiving a write control signal to generate the first voltage during the period in which the write control signal is supplied, and said second voltage generator has an input terminal for receiving the write control signal to generated the second voltage for a predetermined time period upon receipt of the write control signal.

8. A dynamic type semiconductor memory device according to claim 7, wherein said first and second MOS transistors are respectively of p-channel and n-channel types.

9. A dynamic type semiconductor memory device according to claim 8, wherein said driving means has a first power terminal set at a potential of a first level and a second power terminal set at a potential of a second level lower than the first level, said well region is connected to said first power terminal, and said charge pumping means includes a charge pump circuit connected between said semiconductor substrate and said second power terminal for setting the potential of said semiconductor substrate at a third level lower than said second level.

10. A dynamic type semiconductor memory device according to claim 9, wherein said charge pump circuit includes sixth and seventh MOS transistors of n-channel type having current paths connected in series between said semiconductor substrate and said second power terminal, and gates respectively connected to their drains, a pulse oscillator for periodically generating a pulse, and a second capacitor connected between an output terminal of said pulse oscillator and the junction of said sixth and seventh MOS transistors to be charged and discharged respectively through the current paths of said sixth and seventh MOS transistors in response to the rising and falling of each pulse from said pulse oscillator.

11. A dynamic type semiconductor memory device according to claim 10, wherein said first voltage generator is connected to generate the first voltage of said second level, said second voltage generator is connected to generate the second voltage of said first level, said fourth MOS transistor is a p-channel MOS transistor whose current path is connected between the output terminal of said second voltage generator and the gate electrode of said second MOS transistor, and said fifth MOS transistor is an n-channel MOS transistor whose current path is connected between the gate electrode of said second MOS transistor and said semiconductor substrate.

12. A dynamic type semiconductor memory device according to claim 11, wherein the first capacitor of each memory cell is connected in series with the current path of the associated first MOS transistor to receive a voltage of one of said first and second levels as data.

13. A dynamic type semiconductor memory device according to claim 7 wherein said first and second MOS transistors are respectively of n-channel and p-channel types.

14. A dynamic type semiconductor memory device according to claim 13, wherein said driving means has a first power terminal set at a potential of a first level and a second power terminal set at a potential of a second level higher than the first level, said well region is connected to a first power terminal, and said charge pumping means includes a charge pump circuit connected between said semiconductor substrate and a second power terminal for setting the potential of said semiconductor substrate at a third level higher than said second level.

* * * * *